United States Patent [19]

Schweitzer, Jr.

[11] Patent Number: 5,729,125
[45] Date of Patent: Mar. 17, 1998

[54] BRIDGED CLAMPING MECHANISM FOR USE WITH CIRCUIT CONDITION MONITORING DEVICES

[76] Inventor: Edmund O. Schweitzer, Jr., 2433 Center St., Northbrook, Ill. 60062

[21] Appl. No.: 677,649

[22] Filed: Jul. 8, 1996

[51] Int. Cl.$^6$ .................. G01R 31/02; G01R 19/165
[52] U.S. Cl. .................. 324/127; 324/133; 324/551; 336/176
[58] Field of Search .................. 324/127, 133, 324/541, 544, 551; 340/664; 336/176

[56] References Cited

U.S. PATENT DOCUMENTS

| | | | |
|---|---|---|---|
| 4,456,873 | 6/1984 | Schweitzer, Jr. | 324/51 |
| 4,558,276 | 12/1985 | Comeau et al. | 324/127 |
| 4,646,006 | 2/1987 | Schweitzer, Jr. | 324/127 |
| 4,873,706 | 10/1989 | Schweitzer, Jr. | 377/85 |
| 5,140,257 | 8/1992 | Davis | 324/127 |
| 5,180,972 | 1/1993 | Schweitzer, Jr. | 324/127 |
| 5,483,215 | 1/1996 | Mies | 324/127 |
| 5,541,503 | 7/1996 | Berkcan et al. | 324/127 |

*Primary Examiner*—Maura K. Regan
*Attorney, Agent, or Firm*—Lockwood, Alex, Fitzgibbon & Cummings

[57] ABSTRACT

A clamping mechanism for mounting a monitoring device to an electrical cable includes a core assembly formed by a plurality of laminations secured together and arranged in a generally rectangular configuration. A spring spanning the core is anchored at one end to the core at a point near the housing of the monitoring device and at the other end is attached to a bridging member affixed at the opposite end of the core near the housing. This allows the spring to expand less as it transverses the bridge in order to accommodate different power cable diameters.

6 Claims, 2 Drawing Sheets

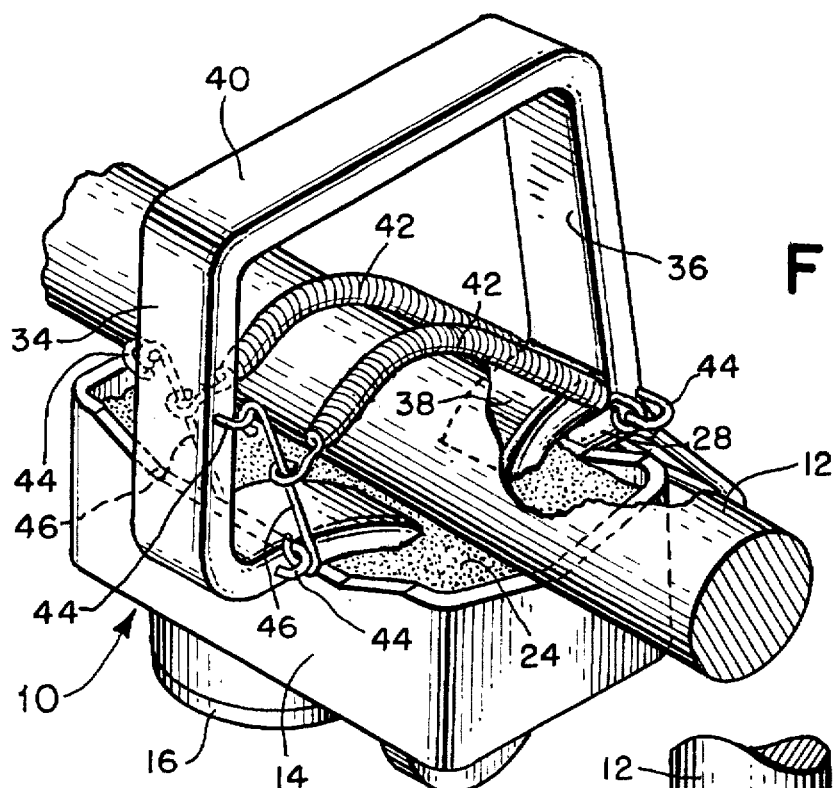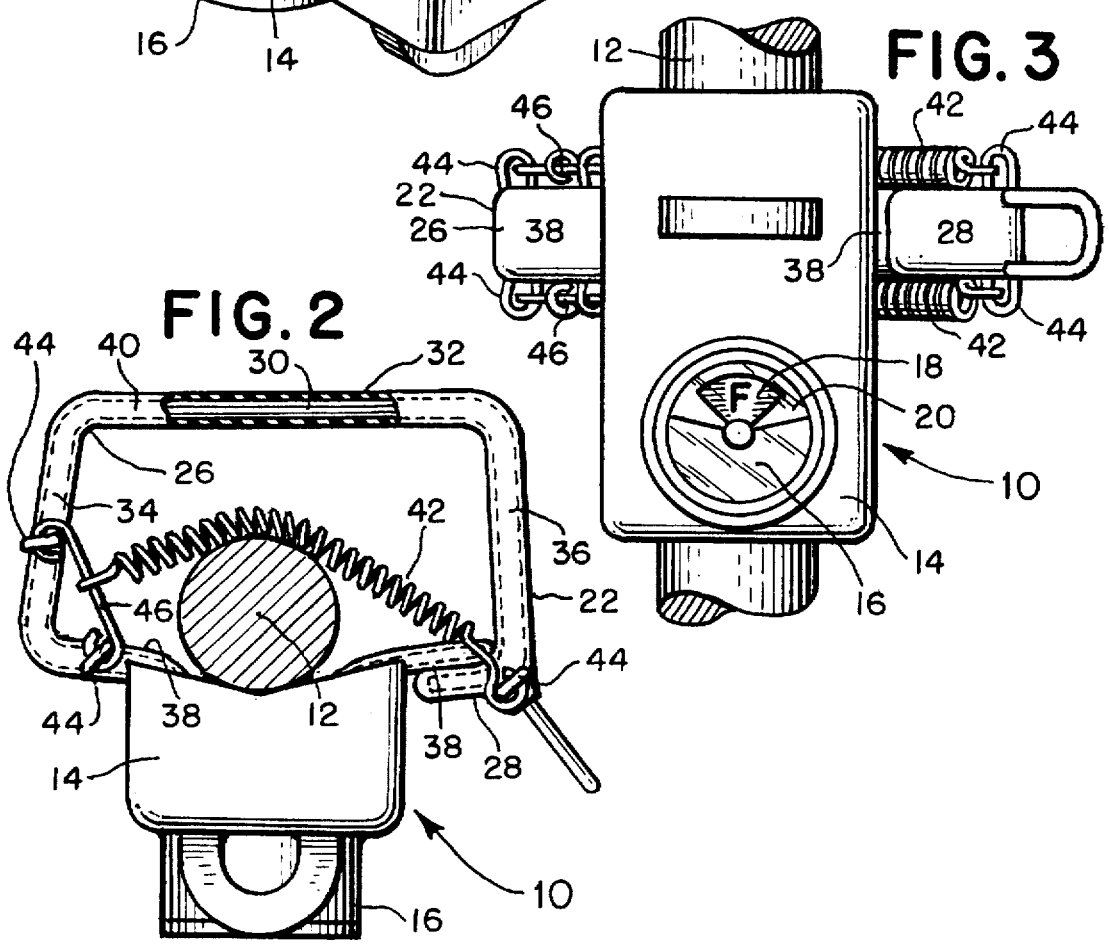

BRIDGED CLAMPING MECHANISM FOR USE WITH CIRCUIT CONDITION MONITORING DEVICES

BACKGROUND OF THE INVENTION

The present invention relates generally to circuit condition monitoring devices for use in electrical power distribution systems, and in particular to a clamp mechanism for clamping such devices to the various sized cables of such systems.

Electrical power distribution systems typically require the use of a variety of monitoring devices to facilitate the detection and location of system malfunctions. Among such devices are manual and automatic reset fault current indicators, as well as voltage monitoring devices. These devices are typically mounted to the system in one of two ways. The first way is the test point style mounted directly on the systems test point. The second way, which is of present interest to the inventor, is the clamp-on type for clamping the monitoring device directly onto a cable of the system.

Clamp-on devices presently in use typically include a housing which contains the monitoring device, a circuit condition indicator, and some form of clamping mechanism integral to the housing for mounting the housing on a cable. In some cases, this device also incorporates some form of communication, either magnetic or electrostatic, between the cable and the monitor.

Clamp mechanisms of the type previously known in the art for mounting distribution system monitoring devices typically worked very well when mounted on an industry standard-sized power cable. However, power cables used in the industry are routinely of various diameters. Consequently, such clamp mechanisms are not always satisfactory for mounting circuit condition monitoring devices to such various cable diameters.

In one prior clamp mechanism, which is described in U.S. Pat. No. 4,456,873 of the present inventor, a plurality of flexible metallic strips are combined to form a generally square-shaped magnetic core for use with a circuit condition monitoring device. One end of the core is fixedly positioned relative to the device housing, and the opposite end is detachably engaged to the one end. In use, the opposite end is displaced from the engagement, allowing the core to be passed around a cable.

In another prior clamp mechanism, which is described in U.S. Pat. No. 4,646,006, also of the present inventor, includes a pair of clamp members biased for engaging movement toward one another. A compression member between the clamp members ordinarily prevents engaging movement of the members. When pressed against a cable, the compression member deforms to allow the clamp members to move toward one another and encircle the cable and clamp the device thereon.

The present invention is directed to a clamping mechanism for clamping a monitoring device to electrical cables of various diameters such as utilized in an electrical distribution system. In particular, the invention is directed to a clamp mechanism which utilizes a bridging element in conjunction with a resilient member thereby allowing a snug fit of the monitoring device to each cable of varying diameter. A considerable amount of resource is saved through use of such a mechanism, as the same clamp can be used for all cable sizes. There is no need for varying clamps to coincide with various sized cables.

Accordingly, it is a general object of the present invention to provide a new and improved clamp mechanism for a circuit monitoring device.

It is a more specific object of the present invention to provide a clamp mechanism for clamping a circuit condition monitoring device to the cable of a power distribution system wherein the cable has various diameters.

SUMMARY OF THE INVENTION

The invention is directed to a clamping mechanism for mounting circuit condition monitoring devices and the like to an electrical cable of a power distribution system. A core member dimensioned to encircle the cable is attached at one end to the monitoring device and engages the monitoring device at its other end when the member has been passed around a cable. A bridge member is anchored on one end at the core at the close proximity to the housing, and on the other end at a position spaced along the core opposite the housing. A resilient member is anchored on one end at the core engagement point with the housing and at the other end on the bridge member so that it transverses the bridge according to varying diameters to power cables while keeping its resilient properties.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view of a clamping mechanism with a power cable clamped on a monitoring device.

FIG. 2 is a cross-sectional view of the clamping mechanism with a power cable clamped on a monitoring device taken along line 2—2 of FIG. 1.

FIG. 3 is a front plan view of the housing device with the present clamping mechanism attached.

DESCRIPTION OF THE PREFERRED EMBODIMENT

Figure 4A:
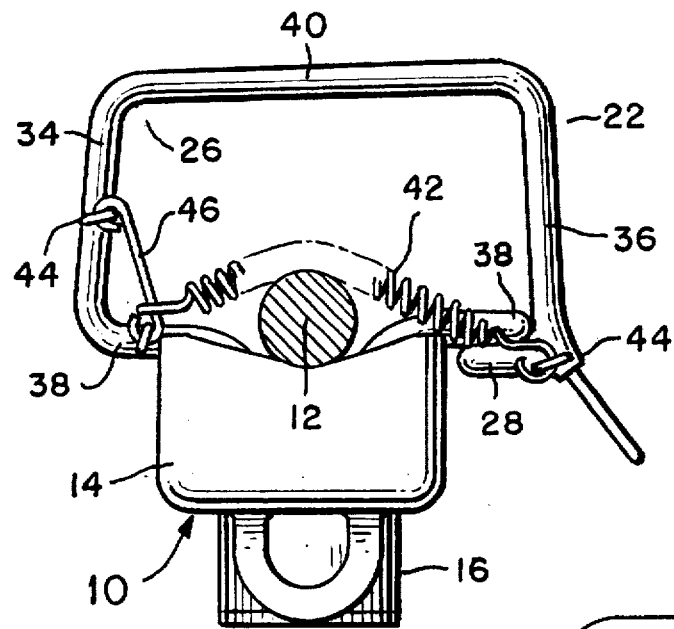
FIGS. 4A, 4B and 4C are cross-sectional views taken along line 2—2 of Figure that depict how the clamping mechanism fits onto varying sized power cables.

Referring to the figures, a circuit monitoring device, in this case a fault current indicator 10, is illustrated in its normal operating position on an electrical cable 12 of an electrical power distribution system. Fault indicator 10 includes a rectangular box shaped housing 14 at the front face of which a cylindrical readout 16 displays the condition of the circuit with an indicator flag 18. The flag is visible through a window 20 provided in the cylindrical readout 16 opposite cable 12. Upon the occurrence of a fault, indicator flag 18 rotates to the position shown to provide a visual indication that current in excess of a predetermined level has flowed in cable 12.

In order for the fault indicator 10 to accurately respond to the occurrence of fault current in the cable 12, it is necessary that the device be firmly positioned adjacent the cable. To this end, the fault indicator is provided with a clamp mechanism 22 constructed in accordance with the invention. As best seen in FIG. 1, the clamp mechanism is attached to the back wall 24 of housing 14 opposite cylindrical readout 16 and fixes the device in close contact with the cable.

A magnetic core assembly 26 is utilized for attaching the housing 14 to a monitored conductor such as cable 12 and for deriving the necessary magnetic flux in sufficient concentration for powering the circuitry of the circuit module. The core assembly is preferably formed as a closed loop of generally rectangular configuration so as to completely encircle cable 12, and includes connection 28 means by which the core can be opened to facilitate installation on or removal from a monitored conductor.

The core assembly 26 is seen to consist of a plurality of individual strips or laminations 30 formed of oriented silicon steel arranged side-by-side in a generally rectangular closed-loop configuration. The core assembly is preferably encapsulated in a layer 32 of vinyl plastisol insulating material. As best seen in FIG. 2, the rectangular configuration includes a generally rectilinear first or left side portion 34, a generally rectilinear second or right side portion 36 opposed to first portion 34, a pair of generally rectilinear third or bottom portions 38, and a generally rectilinear fourth or top portion 40 opposed to third portions 38. The closed loop consisting of side portions 34, 36, 38 and 40 includes connection point 28 at the junction of the second or right side portion 36 and the third or bottom portion 38.

Figure 4B:
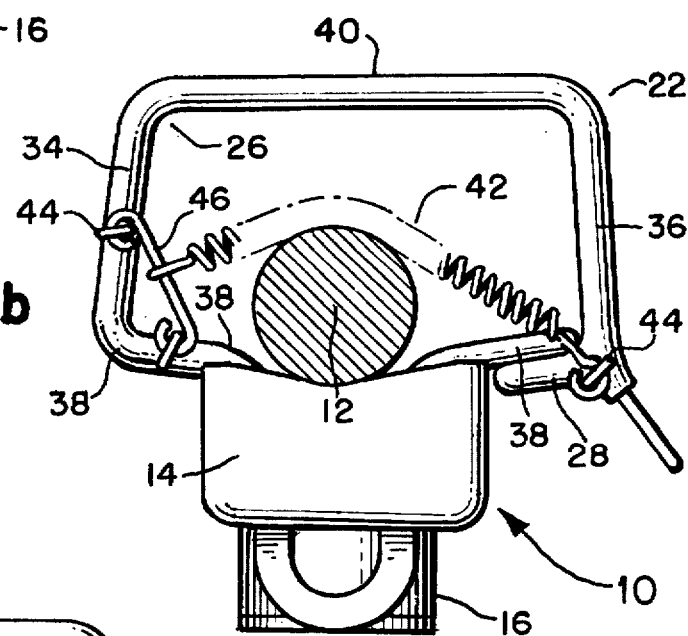
Figure 4C:
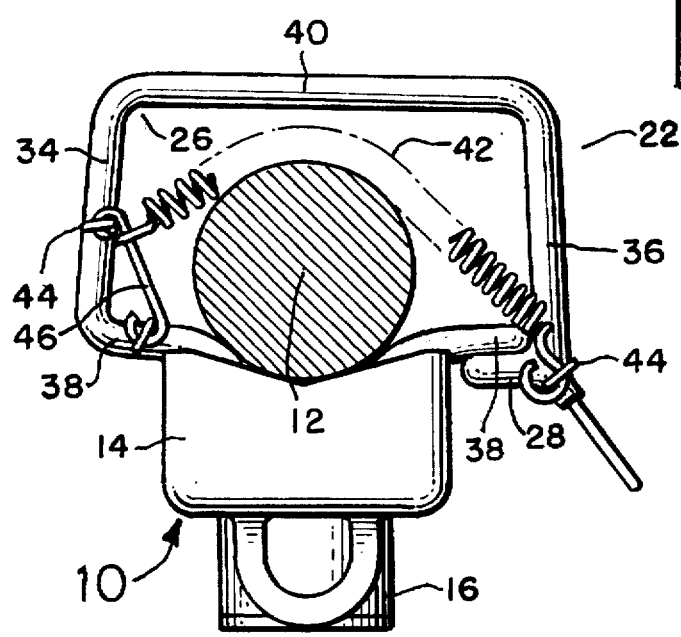

To assist in maintaining the coupling members in engagement, the core structure includes two helical springs 42. One side of each spring is secured to the second or right side portion 36 by a wire clip 44, which includes an eyelet portion for engaging the hooked end of the spring, and a stem portion which extends through the laminations 30. The other hooked end of springs 42 engages a bridge 46 secured on one end to the bottom side portion 38, by a wire clamp 44, and on the other end to the left side portion 34, by a wire clip 44, of the magnetic core assembly 26. Because the spring members can be stretched along their linear axis, they will automatically adapt to encircle cables of differing diameters. In this regard, the springs 42 will transverse the bridge 46 with various sized cables. Accordingly, the clamp mechanism automatically adjusts to the dimension of the particular cable encountered. This adaptation is best illustrated in FIGS. 4A–C where the distance the spring 42 transverse the bridge 46 is dependent upon the diameter of the cable 12.

The bridge, which preferably inclined at a 45° angle relative to the cable engaging surface of the housing, enables the spring to retain its resilient properties as the diameter of the cables increase. If the spring was fixed at both ends, a large cable would tend to overstretch it and cause it to exceed its elastic modulus and thus fail. Failure of the spring reduces the mechanical integrity of the clamp assembly.

Instead, with accommodation of the invention, the bridge member provides a movable anchor at one end of the spring that enables that end of the spring to move as the diameter of the cables change. This allows the spring to extend less than would otherwise be the case. Essentially the bridge member provides a means by which the spring retains its resilient properties over a wide range of cable diameters.

It will be appreciated that while the clamp mechanism has been shown in conjunction with a fault indicating device, it may be used to advantage with other types of monitoring devices, such as voltage indicators.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A clamping mechanism for mounting a circuit condition monitoring device to an electrical cable, comprising:

a housing for said monitoring device;

a core member having a first side portion extending generally from the housing, said first side portion being integral with a second side portion generally parallel to the housing, said second side portion integral with a third side portion generally parallel to said first side portion, said core having mating ends in said third side portion-forming, when separated, a gap for passing the cable through, one of said ends being fixedly positioned relative to said housing and the other end being movable relative to said housing;

at least one resilient member with a first end anchored to said movable end of said third side portion;

a cable mounting surface on said housing;

at least one bridge member with a first end anchored near said housing space between said first side portion and said cable mounting surface, and with a second end anchored at a position spaced on said first side portion; and a second end of said resilient member being slidably attached to said bridge member.

2. A clamping mechanism as defined in claim 1 wherein said core member comprises a plurality of metallic strips.

3. A clamping mechanism as defined in claim 1 wherein said resilient member comprises a helical spring.

4. A housing and clamp assembly for mounting a circuit condition monitoring device to various cable diameters, comprising:

a housing having a cable engaging surface;

a core assembly having first and second side portions extending generally from the housing and joined at their distal ends to encircle the cable, said core including mating ends in said second side portion forming when separated a gap for passing the cable through, one of said ends being fixedly positioned relative to the housing and the other end being movable relative to said housing;

anchoring means comprising a bridging member extending from a fixed position adjacent said housing to a point on the first side portion of said core; and a means for biasing the cable into engagement with said cable engaging surface and for biasing said mating ends into engagement, said biasing means being connected at one end to said movable end, the other end of said biasing means being slidably connected to said bridging member.

5. A housing and clamp assembly as defined in claim 4 wherein said core assembly comprises a plurality of metallic strips.

6. A housing and clamp assembly as defined in claim 4 wherein said biasing means comprises a helical spring.

* * * * *